United States Patent
Yamamoto et al.

(10) Patent No.: US 8,081,007 B2
(45) Date of Patent: Dec. 20, 2011

(54) INSPECTION APPARATUS AND METHOD FOR INSPECTING ELECTRIC CHARACTERISTICS OF DEVICES FORMED ON TARGET OBJECT

(75) Inventors: Yasuhito Yamamoto, Nirasaki (JP); Isamu Inomata, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 556 days.

(21) Appl. No.: 12/146,081

(22) Filed: Jun. 25, 2008

(65) Prior Publication Data

US 2009/0058446 A1   Mar. 5, 2009

(30) Foreign Application Priority Data

Aug. 31, 2007   (JP) .................................. 2007-227182

(51) Int. Cl.
*G01R 31/00* (2006.01)
*G01R 31/20* (2006.01)
(52) U.S. Cl. ............................. 324/750.16; 324/754.11
(58) Field of Classification Search .......................... None
See application file for complete search history.

(56) References Cited

U.S. PATENT DOCUMENTS
2003/0025495 A1   2/2003   Ilno et al.

OTHER PUBLICATIONS

Office Action issued Sep. 21, 2010, in Chinese Patent Application No. 200810109792.0 with English translation.

*Primary Examiner* — Roberto Velez
(74) *Attorney, Agent, or Firm* — Oblon, Spivak, McClelland, Maier & Neustadt, L.L.P.

(57) ABSTRACT

An inspection apparatus for inspecting electric characteristics of a plurality of devices formed on a target object includes a vertical drive mechanism for lifting and lowering a movable mounting table and a control unit for controlling the vertical drive mechanism. The vertical drive mechanism includes an elevation shaft connected to the mounting table and a servo motor for driving the elevation shaft to lift and lower the mounting table. Further, the control unit has a servo driver which includes a position control part for controlling a position of the servo motor, a torque control part for controlling a torque of the servo motor as a probe card is expanded or contracted by a change in temperature and a switching part for switching the position control part and the torque control part.

6 Claims, 3 Drawing Sheets

INSPECTION APPARATUS AND METHOD FOR INSPECTING ELECTRIC CHARACTERISTICS OF DEVICES FORMED ON TARGET OBJECT

FIELD OF THE INVENTION

The present invention relates to an inspection apparatus and an inspection method; and, more particularly, to an inspection apparatus and an inspection method capable of shortening an inspection time.

BACKGROUND OF THE INVENTION

A conventional inspection apparatus includes, e.g., a mounting table for mounting thereon a target object (e.g., a wafer) to be inspected, the mounting table having therein a temperature controller for controlling the temperature of the wafer, a vertical drive mechanism for moving the mounting table up and down, an XY table for moving the mounting table and the vertical drive mechanism in X and Y directions, a probe card arranged above the mounting table, and an alignment mechanism for accurately aligning a plurality of probes of the probe card with a plurality of electrode pads of the target object placed on the mounting table. The temperature of the wafer placed on the mounting table is controlled to a predetermined value by the temperature controller. A specified device formed on the wafer is brought into electrical contact with the probes of the probe card through the alignment mechanism. Then, the probe card is overdriven by a prescribed overdrive amount so that the electric characteristics of the device can be inspected under a predetermined contact load.

In some cases, the inspection apparatus performs a high temperature inspection by heating the wafer to a high temperature of, e.g., 100° C. or more. In other cases, the inspection apparatus carries out a low temperature inspection by cooling the wafer to a temperature of, e.g., minus several tens of degrees centigrade. When performing the high temperature inspection or the low temperature inspection, the target object is heated or cooled to a predetermined inspection temperature by the temperature controller provided in the mounting table. While controlling the position of the mounting table with the vertical drive mechanism, the device and the probes are brought into contact with each other under a specified contact load. The high temperature inspection or the low temperature inspection is performed in this state. The vertical drive mechanism includes, e.g., a ball screw connected to the mounting table and a stepping motor for rotating the ball screw. The stepping motor controls the amount of rotation of the ball screw and, eventually, controls the vertical position of the mounting table with increased accuracy.

In case of performing, e.g., the high temperature inspection of the wafer, the wafer placed on the mounting table is heated to, e.g., 100° C. or more, by use of the temperature controller provided in the mounting table. The wafer placed on the mounting table is aligned with the probes of the probe card by means of the alignment mechanism. In a state that the wafer and the probes are in contact with each other under the predetermined contact load, the electric characteristics of the wafer are inspected at a high temperature of 100° C. or more.

In an initial stage of the inspection, however, the probe card is not yet heated while the wafer is already heated to a temperature of 100° C. or more by the temperature controller. Thus, there exists a great temperature difference between the wafer and the probe card. For this reason, if the wafer is overdriven by a predetermined amount to bring the probes into contact with a first device of the wafer when inspecting the latter, the probe card is heated and gradually expanded by the heat radiated from the wafer during the contact. Therefore, the device and the probes make contact with each other under a load greater than the predetermined contact load, which may possibly cause damage to the device or the probes.

In view of this, the high temperature inspection is performed after preheating and completely heat-expanding the probe card. As the probe card becomes greater in size, however, it takes a long time, e.g., 20 to 30 minutes, to preheat the probe card. For example, Japanese Patent Laid-open Publication No. 2007-088203 (JP2007-088203A) discloses a technique of shortening a preheating time of the probe card by making the probes of the probe card brought into direct contact with a wafer heated to a predetermined temperature and preheating the probe card near the wafer.

In the technique disclosed in JP2007-088203A, however, a preheating time is still required in addition to an actual inspection time. Therefore, there is a limit in shortening the total inspection time. Furthermore, if the wafer is moved away from the probe card during index movement of a target object, the probe card is cooled to thereby change the height of the tips of the probes. For this reason, the contact load is changed each time when the index movement is carried out. In this case, however, it is impossible to control the contact load. Meanwhile, when performing a low temperature inspection of the wafer, there is a need to cool the probe card to a temperature near the wafer temperature.

SUMMARY OF THE INVENTION

In view of the foregoing, the present invention provides an inspection apparatus and an inspection method capable of shortening an inspection time by inspecting a target object without preliminarily heating or cooling a probe card during high temperature inspection or low temperature inspection, and also capable of performing the inspection with increased reliability by positively preventing damage of the probe card and the target object.

In accordance with an aspect of the present invention, there is provided an inspection apparatus for inspecting electric characteristics of a plurality of devices formed on a target object, the apparatus including: a movable mounting table having therein a temperature controller; a vertical drive mechanism for lifting and lowering the mounting table; a control unit for controlling the vertical drive mechanism; and a probe card having a plurality of probes arranged above the mounting table, the target object being heated or cooled to a specified temperature by means of the temperature controller and being inspected while the devices and the probes of the probe card are brought into contact with each other under a predetermined contact load by means of the vertical drive mechanism, wherein the vertical drive mechanism comprises an elevation shaft connected to the mounting table and a servo motor for driving the elevation shaft to lift and lower the mounting table, wherein the control unit comprises a servo driver which includes a position control part for controlling a position of the servo motor, a torque control part for controlling a torque of the servo motor as the probe card is expanded or contracted by a change in temperature and a switching part for switching the position control part and the torque control part.

Preferably, the servo driver is connected to a master computer for monitoring the inspection apparatus, and the master computer includes a position command part for transmitting a position command signal to the position control part, a torque command part for transmitting a torque command signal to the torque control part and a switching command part for transmitting a switching command signal to the switching part based on the torque of the servo motor.

The servo driver may further include a storage part for storing a torque value indicative of a contact load available each time when the electric characteristics of the devices are inspected.

In this case, the storage part may store upper and lower limit values of the predetermined contact load.

Preferably, the torque control part controls a contact load of the devices and the probes in keeping with thermal expansion or contraction of the probe card to become equal to the predetermined contact load.

In this case, the torque control part may stop the servo motor when a contact load of the devices and the probes falls outside a range between the upper and lower limit values.

In accordance with another aspect of the present invention, there is provided an inspection method for inspecting electric characteristics of a plurality of devices formed on a target object by using an inspection apparatus which comprises a movable mounting table having therein a temperature controller; a vertical drive mechanism for lifting and lowering the mounting table; a control unit for controlling the vertical drive mechanism; and a probe card having a plurality of probes arranged above the mounting table, the vertical drive mechanism including an elevation shaft connected to the mounting table and a servo motor for driving the elevation shaft to lift and lower the mounting table, the inspection method comprising: a first step of heating or cooling the target object to a predetermined temperature; a second step of controlling a position of the servo motor until the target object and the probes come into contact with each other; and a third step of controlling a torque of the servo motor after the target object and the probes has come into contact with each other.

The inspection method may further comprise a step of storing a torque value indicative of a contact load available each time when the electric characteristics of the devices are inspected.

In the third step, a contact load of the devices and the probes may be controlled in keeping with thermal deformation of the probe card to become equal to a predetermined contact load.

In the third step, a contact load of the devices and the probes may be controlled to fall within a range between upper and lower limit values of a predetermined contact load.

In the third step, the servo motor may be stopped when a contact load of the devices and the probes falls outside a range between upper and lower limit values of a predetermined contact load.

In accordance with the present invention, it is possible to provide an inspection apparatus and an inspection method capable of shortening an inspection time by inspecting a target object without preliminarily heating or cooling a probe card during high temperature inspection or low temperature inspection, and also capable of performing the inspection with increased reliability by positively preventing damage of the probe card and the target object.

BRIEF DESCRIPTION OF THE DRAWINGS

The objects and features of the present invention will become apparent from the following description of embodiments given in conjunction with the accompanying drawings, in which.

DETAILED DESCRIPTION OF THE EMBODIMENTS

Hereinafter, an embodiment of the present invention will be described with reference FIGS. 1 to 3.

First, an inspection apparatus of the present embodiment will be described with reference to FIG. 1. As shown in FIG. 1, the inspection apparatus 10 of the present embodiment includes, e.g., a mounting table 11 for mounting thereon a target object (e.g., a wafer) W, the mounting table 11 having therein a temperature controller, a vertical drive mechanism 12 for raising and lowering the mounting table 11, an XY table (not shown) on which the mounting table 11 and the vertical drive mechanism 12 are arranged, a probe card 13 arranged above the mounting table 11 and provided with a plurality of probes 13A and an alignment mechanism (not shown) for aligning the wafer W mounted on the mounting table 11 with the probes 13A of the probe card 13. In a high temperature inspection for example, the vertical drive mechanism 12 is designed to change the current position of the mounting table 11 in response to the thermal expansion of the probe card 13, thereby keeping a predetermined contact load at all times so that the inspection can be performed in a stable manner.

In case of performing the high temperature inspection of the wafer W, the wafer W placed on the mounting table 11 is heated to a temperature of, e.g., 100° C. or more by means of the temperature controller. While the mounting table 11 is moved in X and Y directions, the wafer W placed on the mounting table 11 is aligned with the probes 13A by the alignment mechanism. After the wafer W is index-moved by the XY table, the vertical drive mechanism 12 brings one of a plurality of devices formed in the wafer W into electrical contact with the probes 13A under a predetermined contact load. Then, the electric characteristics of each of the devices are inspected at a specified high temperature.

Figure 1:
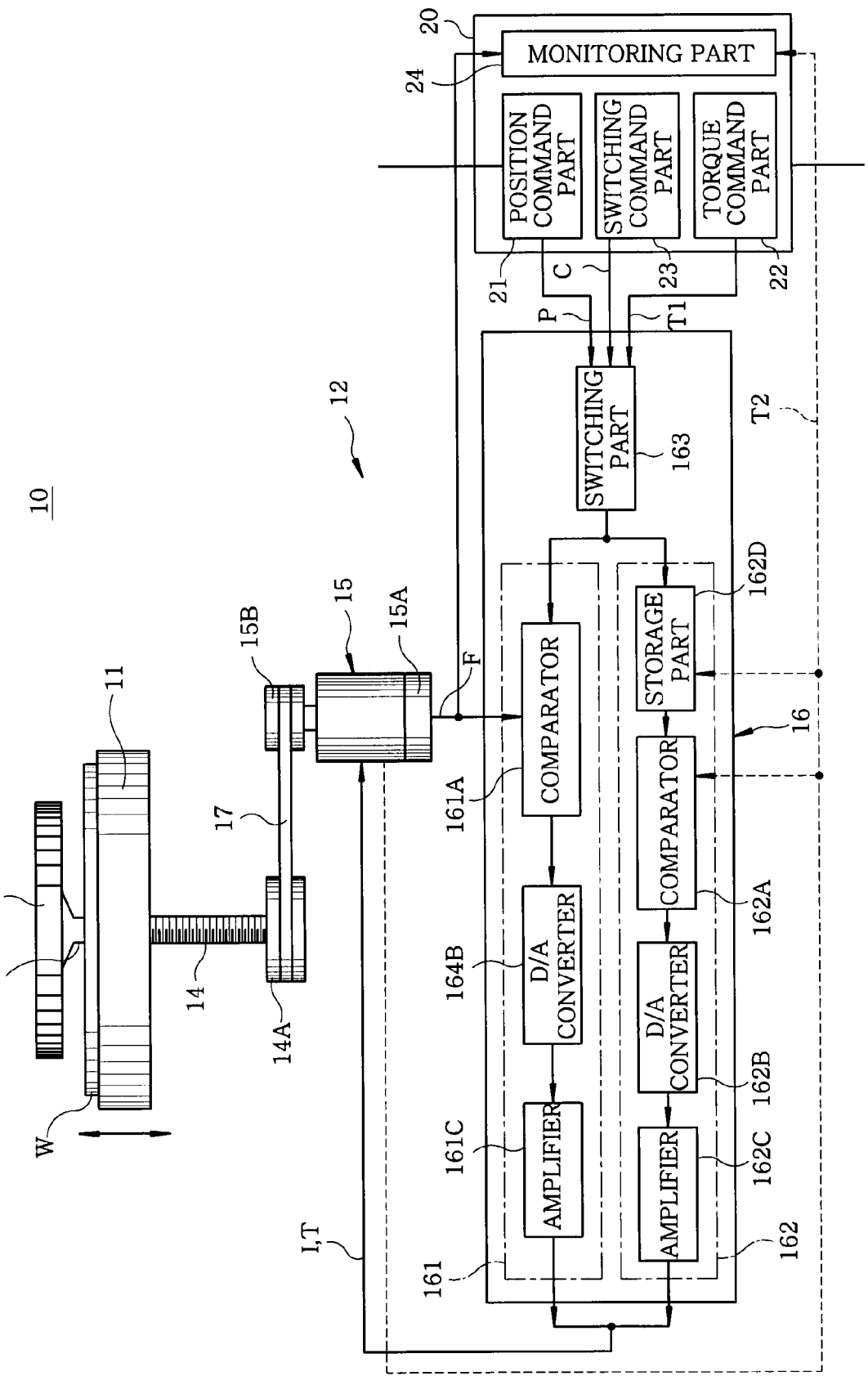
FIG. 1 is a view for explaining major parts of an inspection apparatus in accordance with an embodiment of the present invention.

As can be seen in FIG. 1, the vertical drive mechanism 12 includes a ball screw 14 connected to and suspended from the center of a lower surface of the mounting table 11, a servo motor 15 for rotating the ball screw 14, the servo motor 15 having an encoder 15A, and a servo driver 16 for controlling the operation of the servo motor 15. The servo motor 15 is position-controlled or torque-controlled by the servo driver 16. A nut member 14A is threadedly coupled to the ball screw 14 and a pulley 15B is attached to the servo motor 15. A power transmission belt 17 is wound around the nut member 14A and the pulley 15. The torque of the servo motor 15 is transferred to the ball screw 14 via the pulley 15A, the power transmission belt 17 and the nut member 14A so that the mounting table 11 can be moved up and down.

Use of the servo motor 15 and the servo driver 16 in the vertical drive mechanism 12 ensures that, even if the probe card 13 is thermally expanded, the servo driver 16 controls the position of the servo motor 15 in a below-described manner until the wafer W and the probes 13A come into contact with each other. Thus, the servo driver 16 controls the mounting table 11 with increased accuracy so that the wafer W placed on the mounting table 11 can make electric contact with the probes 13A. After the mounting table 11 is overdriven to assure electric contact between the wafer W and the probes 13A, the position control of the servo motor 15 is switched to the torque control. Then, the servo driver 16 controls the torque of the servo motor 15 with increased accuracy so that the contact load between the wafer W and the probes 13A becomes equal to a predetermined contact load.

More specifically, the servo driver 16 is connected to a master computer 20 through a network as shown in FIG. 1 and is operated by various kinds of command signals issuing from the computer 20. The servo driver 16 includes a position control part 161 for controlling the position of the servo motor 15 in response to the command signals issuing from the master computer 20, a torque control part 162 for controlling the torque of the servo motor 15 in response to the command signals issuing from the master computer 20, and a switching part 163 for switching the position control part 161 and the torque control part 162 in response to the command signals issuing from the master computer 20. The servo driver 16 is designed to control the position or torque of the servo motor 15.

As shown in FIG. 1, the master computer 20 includes a position command part 21 for transmitting a position command signal P to the position control part 161, a torque command part 22 for transmitting a torque command signal T1 to the torque control part 162, a switching command part 23 for transmitting a switching command signal C to the switching part 163, and a monitoring part 24 for monitoring the mounting table 11 through the servo motor 15. Even when the probe card 13 is thermally expanded during the high temperature inspection, the monitoring part 24 monitors the mounting table 11 with reference to a feedback signal F or a torque signal T2 issuing from the servo motor 15. Based on the monitoring results, the position command signal P, the torque command signal T1 or the switching command signal C is transmitted to the servo driver 16. Thus, one of the devices of the wafer W placed on the mounting table 11 is made to contact with the probes 13A under a predetermined contact load so that the high temperature inspection can be performed with increased reliability. Furthermore, the monitoring part 24 monitors the whole inspection process of the wafer W performed in the inspection apparatus 10 and transmits the switching command signal C to the servo driver 16 each time when the inspection of each device of the wafer W is completed. In addition, the master computer 20 is also connected to servo drivers of other inspection apparatuses to monitor the latter.

As shown in FIG. 1, the position control part 161 includes a comparator 161A for comparing the position command signal P transmitted from the master computer 20 with the feedback signal F supplied from the encoder 15A to generate a digital deviation signal, a D/A converter 161B for converting the digital deviation signal generated in the comparator 161A to an analog signal, and an amplifier 161C for amplifying an electric current supplied from the D/A converter 161B. The position control part 161 is designed to rotatably drive the servo motor 15 based on an output current I fed from the amplifier 161C.

As can be seen in FIG. 1, the torque control part 162 includes a comparator 162A for comparing the torque command signal T1 issuing from the master computer 20 with the current value (the torque signal) T2 supplied from the servo motor 15 to generate a digital deviation signal, a D/A converter 162B for converting the digital deviation signal generated in the comparator 162A to an analog signal, and an amplifier 162C for amplifying the analog signal supplied from the D/A converter 162B. The torque control part 162 is designed to control the torque of the servo motor 15 based on a torque signal (an electric current) T fed from the amplifier 162C. The torque control part 162 further includes a storage part 162D for storing, as a torque value, the contact load available in the previous high temperature inspection and the tolerance values (the upper and lower limit values) of the contact load. The torque value stored in the storage part 162D is set as a contact load when the next device is subjected to the high temperature inspection. Furthermore, the torque value is controlled to fall within a permissible torque range between an upper and a lower limit value available during the high temperature inspection. The torque control part 162 is designed to stop the inspection in the event that the torque value falls outside the permissible torque range for any reason.

As shown in FIG. 1, the switching part 163 is operated in response to the switching command signal C issuing from the master computer 20 and is designed to alternately switch the position control part 161 and the torque control part 162. For example, the servo motor 15 lifts up the mounting table 11 with a constant torque under the control of the position control part 161 to thereby bring the wafer W placed on the mounting table 11 into contact with the probes 13A, and the torque is changed if the mounting table 11 is overdriven thereafter. At this time, the monitoring part 24 of the master computer 20 is monitoring the torque signal T2. If the torque signal T2 is changed due to the overdrive of the mounting table 11, a switching command signal is transmitted from the switching command part 23 to the switching part 163. Consequently, the position control part 161 is switched to the torque control part 162 which in turn controls the torque of the servo motor 15. In a conventional case, the probe card 13 is thermally expanded and the tips of the probes 13A are pressed against the corresponding device. As a result, the contact load exceeds a predetermined value, which may possibly cause damage to the device or the probes.

In the present embodiment, however, the servo motor 15 is switched from the position control to the torque control and is reversely rotated a little bit to slightly reduce the torque, whereby the torque is controlled to become a torque value corresponding to the predetermined contact load. Once the high temperature inspection is completed under the predetermined contact load, the master computer 20 performs index movement of the wafer W in response to the signals supplied from the inspection apparatus 10 and then transmits a switching command signal C to the servo driver 16 to switch the torque control to the position control. Subsequently, the next device is subjected to the high temperature inspection.

Next, an inspection method using the inspection apparatus 10 of the present embodiment will be described with reference to FIGS. 1 to 3.

If the wafer W is mounted on the mounting table 11 in a conventional manner, the wafer W is heated to a high temperature of 100° C. or more by means of the temperature controller. During this, the mounting table 11 is moved in the X and Y directions and the wafer W is aligned with the probes 13A of the probe card 13 by means of the alignment mechanism. After the alignment is completed, the mounting table 11 is moved in the X and Y directions so that the device to be inspected first arrives just below the probes 13A.

Once the first device of the wafer W arrives just below the probes 13A, the master computer 20 transmits a position command signal P to the position control part 161 of the servo driver 16. Then, as illustrated in FIG. 2, the servo driver 16 begins to control the position of the servo motor 15 (step S1). In the position control part 161, the comparator 161A receives the position command signal P from the master computer 20 and also receives the feedback signal F from the encoder 15A of the servo motor 15. Then, the comparator 161A transmits a deviation signal indicative of the deviation between the position command signal P and the feedback signal F to the D/A converter 161B. The D/A converter 161B converts the deviation signal to an analog signal and transmits the analog signal to the amplifier 161C. The amplifier 161C amplifies the electric current received from the D/A converter 161B and applies the amplified current to the servo motor 15, thus lifting up the mounting table 11. As the mounting table 11 is lifted up and the wafer W is moved toward the probe card 13, the probe card 13 is gradually heated and thermally expanded by the heat radiated from the mounting table 11. Then, the mounting table 11 is overdriven to bring the wafer W and the probes 13A into electrically conducting contact with each other (step S2).

The probes 13A are directly heated by the wafer W due to the contact between the probes 13A and the wafer W. Also, the probe card 13 is gradually heated by the heat radiated from the mounting table 11, thereby causing heat expansion of the probe card 13 as a whole. As a result, as indicated by a dashed dotted line in FIG. 3A, the height of electric contact between the electrode pads Dp of the device D and the probes 13A becomes lower than an original contact height. Therefore, the probes 13A are pushed up to the position indicated by a solid line in FIG. 3A. Consequently, the electrode pads Dp and the probes 13A come into contact with each other under a contact load greater than the predetermined contact load.

Figure 2:
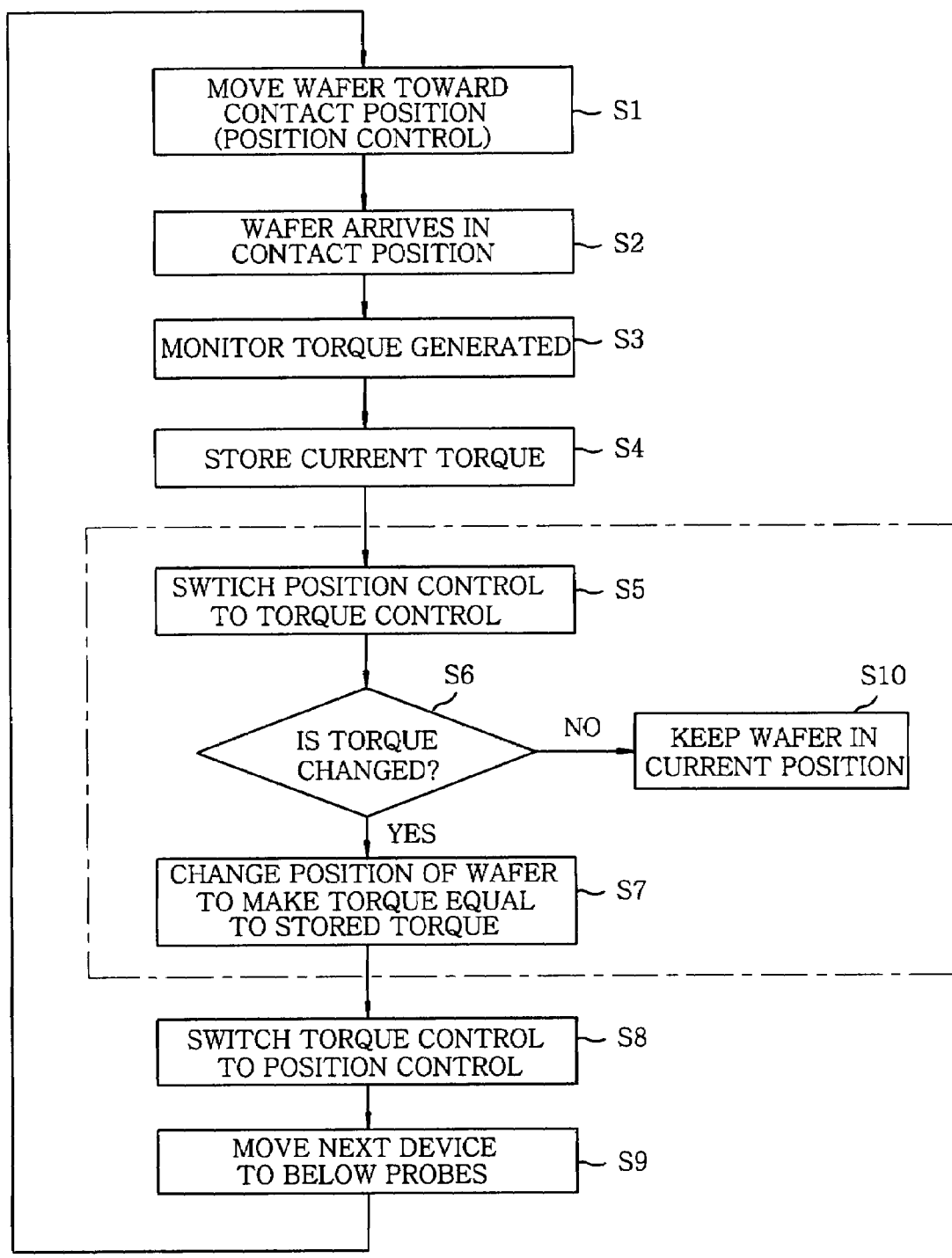
FIG. 2 is a flowchart illustrating an inspection method of the present invention performed by the inspection apparatus shown in FIG. 1.
Figure 3A:
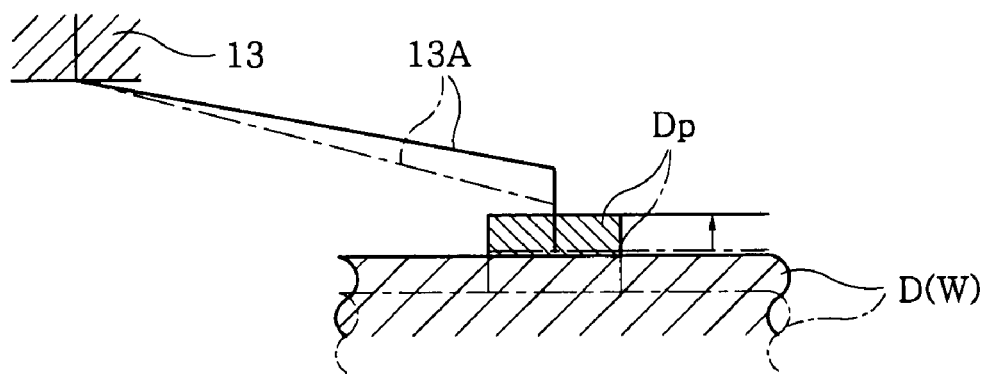
FIGS. 3A and 3B are views for explaining the inspection method illustrated in FIG. 2.
Figure 3B:
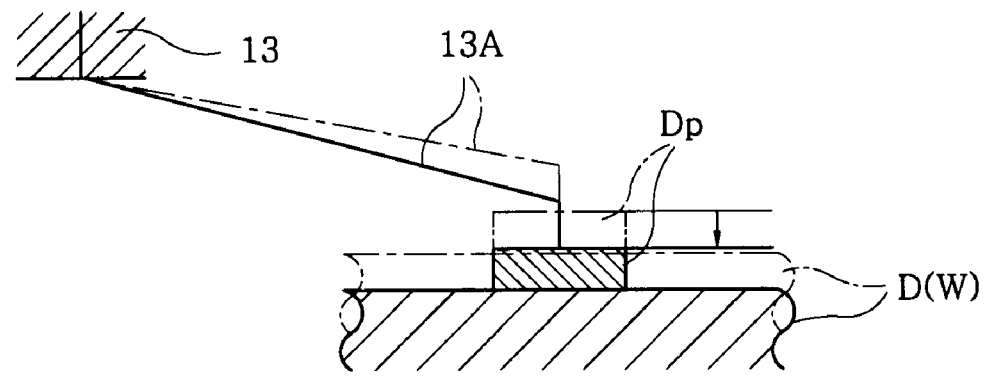

In the present embodiment, as illustrated in FIG. 2, the master computer 20 monitors the torque generated in the servo motor 15 by the overdrive (step S3) and stores the current torque T2 of the servo motor 15 in the storage part 162D of the servo driver 16 (step S4) as shown in FIG. 1. At the same time, the master computer 20 transmits a switching command signal C to the switching part 163 of the servo driver 16 and allows the switching part 163 to switch the position control part 161 to the torque control part 162 (step S5) so that the torque control part 162 can perform torque control.

In the servo driver 16, the comparator 162A compares the current torque signal T2 supplied from the servo motor 15 with the torque signal transmitted from the storage part 162D to determine whether or not there is a change in torque due to a difference between both signals (step S6). If the torque is changed, a deviation signal indicative of the same is transmitted to the amplifier 162C to control the torque of the servo motor 15. Then, the servo driver 16 rotates the ball screw 14 in the reverse direction so that the torque of the servo motor 15 can be reduced to the predetermined torque. Thus, the probes 13A are lowered from the position indicated by a dashed dotted line in FIG. 3B to the position indicated by a solid line (step S7). In this state, the high temperature inspection of the device D is performed under the predetermined contact load. The torque value of the servo motor 15 available at this time is registered and stored in the storage part 162D. The torque value thus registered is used in the second device inspection.

During this process, the master computer 20 continues to monitor the change in torque and transmits a switching command signal C to the servo driver 16 if the position of the mounting table 11 is adjusted by the torque change. As illustrated in FIG. 2, the servo driver 16 allows the switching part 163 to switch the torque control part 162 to the position control part 161 (step S8). The position of the servo motor 15 is controlled to return the mounting table 11 back to a lowermost position. Then, the wafer W is index-moved to bring the next device D to a position just below the probes 13A (step S9). In this state, the process returns to step S1 where the servo motor 15 is controlled to bring the device D and the probes 13A into contact with each other.

In case of performing the high temperature inspection of the second device D, steps 1 to 5 are repeated in the same manner as set forth above. The current torque value is compared with the previously registered torque value by means of the comparator 162A. The torque of the servo motor 15 is controlled on the basis of the previously registered torque value and the device D is subjected to the high temperature inspection.

If the thermal expansion of the probe card 13 ceases to exist while repeating the inspection, the servo driver 16 is switched to the torque control. This ensures that the torque of the servo motor 15 is not changed even if the electrode pads Dp of the device D and the probes 13A come into contact with each other. Therefore, the process proceeds from step S6 to step S10 in FIG. 2 and the high temperature inspection of the device D is performed while the mounting table 11 is kept in the current position. In this inspection, the wafer W remains spaced apart from the probes 13A during the index-movement of the wafer W. For this reason, the probe card 13 is cooled a little bit by temporarily radiating heat. However, this has little influence on the inspection. Even if the inspection is affected by this, it is possible to perform the inspection of the wafer W under the predetermined contact load at all times since the torque of the servo motor 15 continues to be controlled by the servo driver 16.

With the present embodiment described above, the servo motor 15 is used as the vertical drive mechanism 12 of the mounting table 11 and the torque of the servo motor 15 is controlled by the servo driver 16. This makes it possible to immediately perform the high temperature inspection of the wafer W without having to preheat the probe card 13. Elimination of the preheating time helps greatly shorten the inspection time. Furthermore, it is possible to surely prevent damage of the probe card 13 and the wafer W, thereby enabling the inspection to be performed with increased reliability.

With the present embodiment, the servo driver 16 is connected to the master computer 20 that monitors the inspection apparatus 10. The master computer 20 includes the position command part 21 for transmitting the position command signal P to the position control part 161, the torque command part 22 for transmitting the torque command signal T1 to the torque control part 162, and the switching command part 23 for transmitting the switching command signal C to the switching part 163 based on the torque of the servo motor 15. This makes it possible to monitor the operating state of the vertical drive mechanism 12 at all times. Therefore, the high temperature inspection can be performed with increased reliability by bringing the wafer W placed on the mounting table 11 into contact with the probes 13A under the predetermined contact load at all times.

Furthermore, the servo driver 16 is provided with the storage part 162D for storing the torque value indicative of the contact load available each time when the high temperature inspection of the device D is performed. This makes it possible to set the predetermined contact load in keeping with the expansion of the probe card 13. Moreover, the storage part 162D is designed to store the upper and lower limit values of the predetermined contact load. This eliminates the possibility that the device D and the probes 13A make contact with each other under a load falling outside the predetermined contact load, thereby reliably preventing damage of the device D and the probes 13A. In addition, the torque control part 162 controls the contact load between the device D and the probes 13A to become equal to the predetermined contact load in keeping with the thermal change of the probe card 13.

This makes it possible to perform the inspection under a constant contact load at all times even if the probe card 13 undergoes thermal expansion.

The present invention is not limited to the above-described embodiment at all and the constituent elements of the present invention may be suitably changed in design. For example, although the servo motor and the ball screw are connected by means of the power transmission belt in the above description, it may be possible to directly connect the servo motor to the ball screw. Furthermore, although the high temperature inspection of the wafer W is described in the foregoing embodiment, the present invention may be equally applied to a low temperature inspection of the wafer. Moreover, although the wafer is described as an example of the target object in the foregoing embodiment, the present invention may be applied to the inspection of a glass substrate of a liquid crystal display.

The present invention can be applied to an inspection apparatus for inspecting electric characteristics of a target object such as a semiconductor wafer or the like.

What is claimed is:

1. An inspection apparatus for inspecting electric characteristics of a plurality of devices formed on a target object, the apparatus comprising:
    a movable mounting table having therein a temperature controller;
    a vertical drive mechanism for lifting and lowering the mounting table;
    a control unit for controlling the vertical drive mechanism; and
    a probe card having a plurality of probes arranged above the mounting table, the target object being heated or cooled to a specified temperature by means of the temperature controller and being inspected while the devices and the probes of the probe card are brought into contact with each other under a predetermined contact load by means of the vertical drive mechanism,
    wherein the vertical drive mechanism includes an elevation shaft connected to the mounting table and a servo motor for driving the elevation shaft to lift and lower the mounting table,
    wherein the control unit includes a servo driver which includes a position control part for controlling a position of the servo motor, a torque control part for controlling a torque of the servo motor and a switching part for switching between the position control part and the torque control part.

2. The inspection apparatus of claim 1, wherein the servo driver is connected to a master computer for monitoring the inspection apparatus, the master computer including a position command part for transmitting a position command signal to the position control part, a torque command part for transmitting a torque command signal to the torque control part and a switching command part for transmitting a switching command signal to the switching part based on the torque of the servo motor.

3. The inspection apparatus of claim 1, wherein the servo driver further includes a storage part for storing a torque value indicative of a contact load available each time when the electric characteristics of the devices are inspected.

4. The inspection apparatus of claim 3, wherein the storage part stores upper and lower limit values of the predetermined contact load.

5. The inspection apparatus of claim 1, wherein the torque control part controls a contact load of the devices and the probes in keeping with thermal expansion or contraction of the probe card to become equal to the predetermined contact load.

6. The inspection apparatus of claim 4, wherein the torque control part stops the servo motor when a contact load of the devices and the probes falls outside a range between the upper and lower limit values.

* * * * *